(12) United States Patent
Li et al.

(10) Patent No.: US 6,432,841 B1
(45) Date of Patent: Aug. 13, 2002

(54) METHOD FOR FORMING A DIELECTRIC

(75) Inventors: Li Li, Meridian; Randhir Thakur, Boise; Richard C. Hawthorne, Nampa, all of ID (US)

(73) Assignee: Micron Technology, Inc., Boise, ID (US)

( * ) Notice: Subject to any disclaimer, the term of this patent is extended or adjusted under 35 U.S.C. 154(b) by 56 days.

(21) Appl. No.: 09/696,357

(22) Filed: Oct. 25, 2000

Related U.S. Application Data

(63) Continuation of application No. 08/881,519, filed on Jun. 24, 1997, now Pat. No. 6,207,587.

(51) Int. Cl.[7] .............................................. H01L 21/31
(52) U.S. Cl. ........................................................ 438/769
(58) Field of Search ................................ 438/239, 510, 438/513, 517, 568, 758, 764, 766, 769, 770, 775; 427/579, 583

(56) References Cited

U.S. PATENT DOCUMENTS

| | | |
|---|---|---|
| 3,652,324 A | 3/1972 | Chu et al. |
| 3,765,935 A | 10/1973 | Rand et al. |
| 4,282,270 A | 8/1981 | Nozaki et al. |
| 4,298,629 A | 11/1981 | Nozaki et al. |
| 4,402,997 A | 9/1983 | Hogan et al. |
| 4,962,065 A | 10/1990 | Brown et al. |
| 5,260,236 A | 11/1993 | Petro |
| 5,264,396 A | 11/1993 | Thakur et al. |
| 5,283,204 A | 2/1994 | Rhodes et al. |
| 5,360,769 A | 11/1994 | Thakur et al. |
| 5,372,974 A | 12/1994 | Doan et al. |
| 5,376,593 A | 12/1994 | Sandhu et al. |
| 5,382,533 A | 1/1995 | Ahmad et al. |
| 5,382,551 A | 1/1995 | Thakur et al. |
| 5,397,720 A | 3/1995 | Kwong et al. |
| 5,403,630 A | 4/1995 | Matsui |
| 5,405,492 A | 4/1995 | Moslehi |
| 5,407,870 A | 4/1995 | Okada et al. |
| 5,425,392 A | 6/1995 | Thakur et al. |
| 5,445,999 A | 8/1995 | Thakur et al. |
| 5,464,792 A | 11/1995 | Tseng et al. |
| 5,474,955 A | 12/1995 | Thakur |
| 5,541,436 A | 7/1996 | Kwong et al. |
| 5,587,344 A | 12/1996 | Ishikawa |
| 5,591,494 A | 1/1997 | Sato |
| 5,674,788 A | * 10/1997 | Wristers et al. ..... 148/DIG. 118 |
| 5,773,325 A | 6/1998 | Teramoto |
| 5,821,172 A | 10/1998 | Gilmer |
| 5,908,312 A | 6/1999 | Cheung |
| 5,926,689 A | 7/1999 | Cote |
| 5,930,627 A | 7/1999 | Zhou |

OTHER PUBLICATIONS

Superthin O/N/O Stacked Dielectrics Formed by Oxidizing Thin Nitrides in Low Pressure Oxygen for High–Density Memory Devices, Nov. 1994.

* cited by examiner

Primary Examiner—Michael J. Sherry
Assistant Examiner—Lisa Kilday
(74) Attorney, Agent, or Firm—TraskBritt

(57) ABSTRACT

A method of forming a selected dielectric that includes the steps of contacting a suitable substrate having a silicon-containing layer with a gas mixture containing atomic nitrogen, nitric oxide and their reactive constituents at a pressure and temperature sufficient for effective dielectric layer formation for the selected dielectric layer.

14 Claims, 3 Drawing Sheets

METHOD FOR FORMING A DIELECTRIC

CROSS-REFERENCE TO RELATED APPLICATION

This application is a continuation of application Ser. No. 08/881,519, filed Jun. 24, 1997, now U.S. Pat. No. 6,207,587 B1, issued on Mar. 27, 2001.

BACKGROUND OF THE INVENTION

1. Field of the Invention

This invention relates generally to a process for forming a high-quality dielectric layer for a semiconductor substrate. More particularly, it relates to a better controlled process utilizing atomic nitrogen and nitric oxide to form a more reliable and predictable dielectric layer.

2. State of the Art

In order to build an integrated circuit, many active devices need to be fabricated on a single surface. The current practice in many areas of semiconductor manufacturing is to use thin film fabrication techniques. A large variety of materials can be deposited using thin films, including metals, semiconductors, insulators and the like. The composition and uniformity of these thin layers must be strictly controlled to facilitate other necessary fabrication techniques, such as the etching of submicron features onto the circuit or component. The dielectric material is a pivotal component in the manufacture and performance of integrated circuits that must respond to the demand for decreasing size of device geometries and simultaneous increases in packing density. The characteristics of the dielectric exert a large influence over the long-term reliability of every device in which a dielectric is present.

Metal oxide semiconductor (MOS) device technology increasingly requires ultrathin dielectric layers. Ultrathin dielectric layers must meet existing demands for performance and integrity in the face of the added constraint of an ultrathin layer.

It has been recognized that silicon dioxide ($SiO_2$) cannot adequately meet the rigorous requirements for a dielectric as technology improvements require thinner and ultrathin dielectric layers.

In the search for acceptable dielectric materials to meet the more stringent requirements, several alternatives have been pursued. Two widely used alternatives are silicon nitride ($Si_3N_4$) and oxynitrides.

Silicon nitride ($Si_3N_4$) can be deposited using a number of techniques. Those techniques fall into two general categories: low pressure chemical vapor deposition (LPCVD) and plasma enhanced chemical vapor deposition (PECVD). The LPCVD methods use anhydrous ammonia ($NH_3$) as the nitrogen source and, typically, silicon hydride ($SiH_4$) or $SiCl_2H_2$ to provide the silicon for the deposition. The temperature ranges associated with the LPCVD of silicon nitride generally are between 600° and 900° C.

The PECVD methods of depositing silicon nitride typically use $SiH_4$ as the source of silicon and either $NH_3$ or $N_2$ as a nitrogen source at lower temperatures than the LPCVD techniques. PECVD temperatures for silicon nitride generally are in the range of 200° to 400° C. Within these broad categories of techniques, refinements in the deposition process have been introduced. For example, U.S. Pat. No. 5,298,629 discloses a method of PECVD of silicon nitride using nitrogen ($N_2$) or ammonia ($NH_3$) in a plasma chamber containing a silicon body and following this step with an ammonia treatment in a non-plasma atmosphere.

Currently, the $Si_3N_4$ layers are reoxidized after deposition to improve their dielectric qualities. For example, the reoxidation operates to reduce defects such as pinholes and leakage current. The reoxidation of the $Si_3N_4$ layers typically is accomplished by high-temperature treatment in steam or an oxygen ($O_2$) ambient environment.

With current fabrication techniques, the $Si_3N_4$ films cannot be reduced below approximately 65 Å because a $Si_3N_4$ layer thinner than this cannot withstand the subsequent oxidation step used to improve the dielectric qualities of the $Si_3N_4$ layer. But, as discussed above, thinner layers are increasingly required to accommodate the smaller device geometries and increased packing densities.

Silicon oxynitrides are another class of dielectric material currently in wide use. While similar to reoxidized $Si_3N_4$, they also represent an alternative manufacturing choice for dielectric layer formation. Several methods are used to form oxynitride layers. In one method, a silicon substrate is first oxidized to silicon dioxide and then overlaid with a polysilicon layer that is implanted with nitrogen, followed by an annealing step. In another method, a silicon substrate is treated using a rapid thermal annealing step in a nitrous oxide ambient environment. Silicon oxynitride layers are also produced by deposition processes using silicon hydride ($SiH_4$), ammonia ($NH_3$) and either nitric oxide (NO) or nitrous oxide ($N_2O$) to produce films having specific compositions. The films using $N_2O$ have shown good electrical characteristics, but have inadequate nitrogen incorporation to prevent boron penetration and incorporation. The use of NO results in more nitrogen incorporation in the layer, but the growth of the oxynitride layer is undesirably slow.

The trend towards smaller geometries and more densely packed devices in IC fabrication requires attendant accommodations in dielectric formation methods. Dielectric fabrication needs to be reworked to oxidation methods that thinner $Si_3N_4$ layers can tolerate, as well as more controlled and responsive oxynitride growth methods.

BRIEF SUMMARY OF THE INVENTION

The present invention is directed to a method of controlling nitrogen and oxygen reactive constituent formation to form high-quality dielectric films or layers on a semiconductor- containing device. The purpose of the invention is to better control the nitrogen (N) and oxygen (O) concentrations in high-quality dielectric formation processes. The method of this invention employs atomic nitrogen (N) and nitric oxide (NO). The NO is introduced into a gas flow containing the atomic N prior to arriving at the reaction target. The amount of NO introduced into the gas flow of the desired reaction can be closely controlled and permits the control and manipulation of formation of the resulting reactive chemical constituents to create the desired fabrication of film.

Additional advantages and novel features of the invention will be set forth in part in the description that follows, and in part will become apparent to those skilled in the art upon examination of the following or may be learned by practice of the invention. The advantages of the invention may be realized and attained by means of the instrumentalities and combinations particularly pointed out in the appended claims.

DETAILED DESCRIPTION OF THE INVENTION

Figure 1:
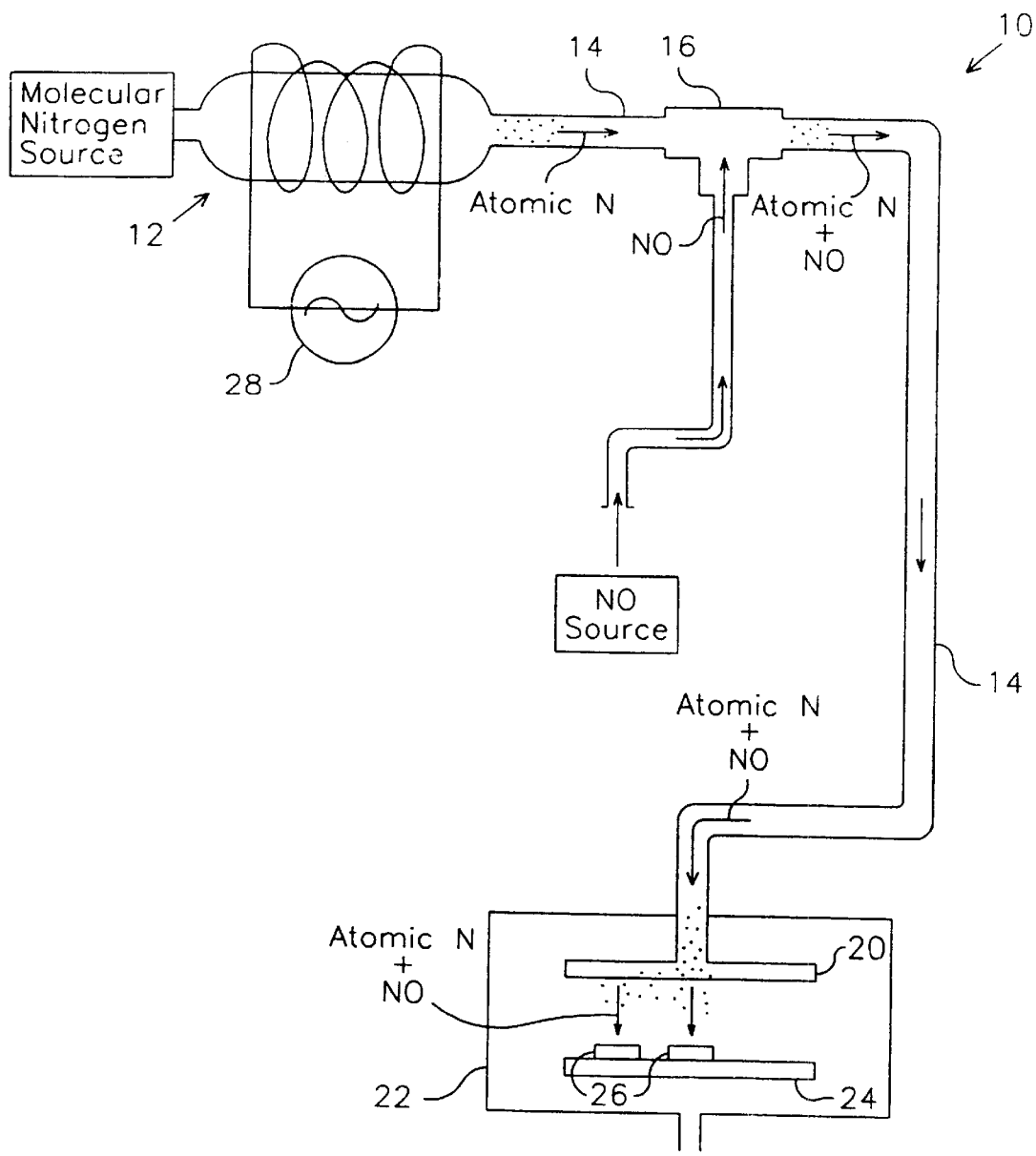
FIG. 1 is a schematic representation of a downstream plasma system suitable for use with the described exemplary embodiment of this invention.
Figure 2:
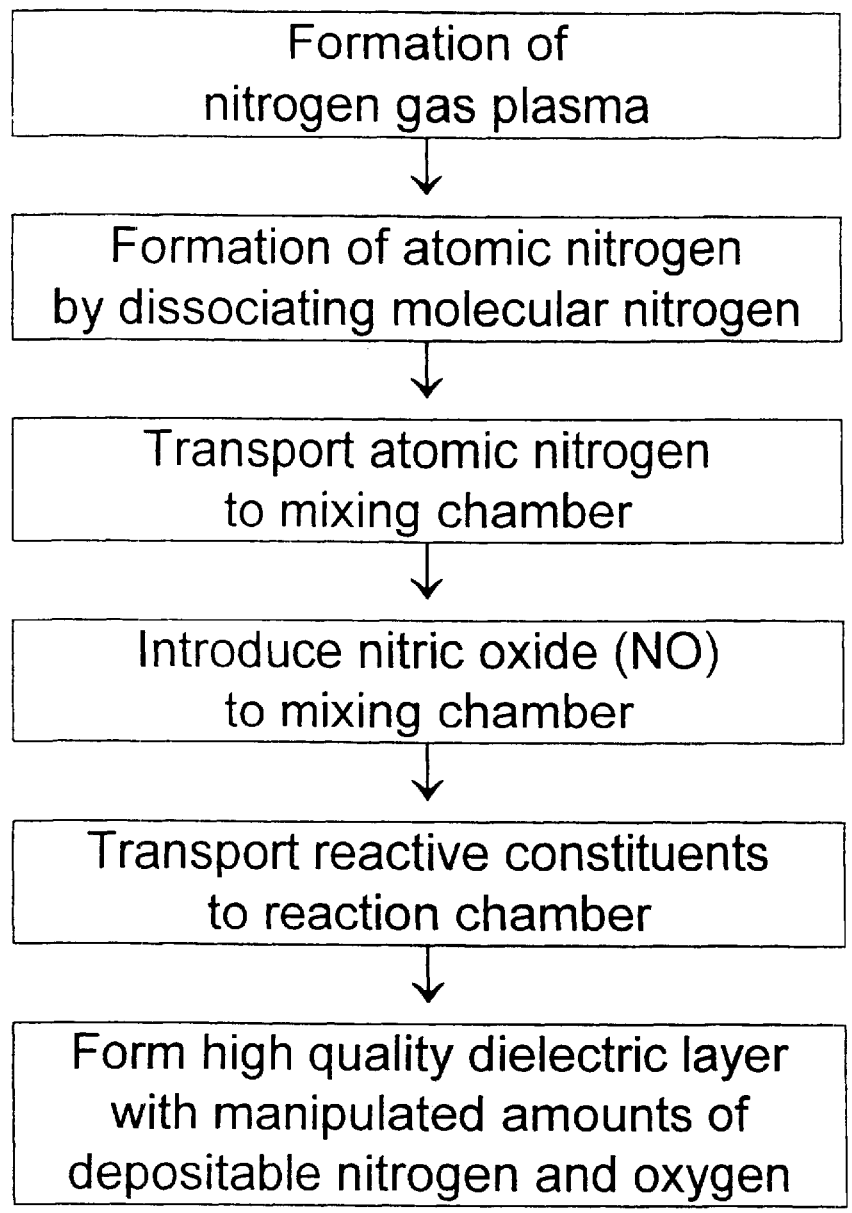
FIG. 2 is a flow chart of the steps for the given exemplary embodiment of the process of this invention.

The high-quality dielectric forming method of the present invention is characterized by the use of atomic nitrogen (N) and nitric oxide (NO). In the described embodiment, the atomic N and NO are employed in a downstream plasma process permitting improved control of the nitrogen and oxygen reaction to form high-quality dielectric films or layers on a semiconductor- containing device. The invention allows better control of the nitrogen and oxygen reaction in terms of amount and location of each of the respective elements deposited in a dielectric film formation. Examples of using this method to form a high-quality capacitor dielectric on a semiconductor-containing substrate include the reoxidation of a silicon nitride ($Si_3N_4$) dielectric layer and the formation or growth of an oxynitride dielectric layer on a silicon-containing substrate.

Accordingly, in an exemplary embodiment of the present invention, an improved method for forming a high-quality dielectric is described. It includes using atomic N and the controlled introduction of NO into a gas flow containing the atomic N, prior to exposure to the target substrate for dielectric layer formation. Atomic N reacts readily and very rapidly with NO in a bimolecular reaction. When atomic N reacts with nitric oxide, the same amount of oxygen is formed as the amount of NO available. In contrast to the fast reaction of N with NO, the reaction of N with O is very slow, occurring in a trimolecular reaction. The molecularity of a reaction refers to the number of molecules involved in forming the activated complex in a step of a chemical reaction. In the case of a bimolecular reaction, two molecules are involved, and in the case of a trimolecular reaction, three molecules are involved. By controlling and adjusting the amount of NO introduced and available to react with the atomic N as well as the timing of NO injection or introduction, controlled atomic N and atomic O concentration is obtained at the target, and a high-quality dielectric can be formed.

In the case of $Si_3N_4$ dielectric films, this method allows reoxidation of the $Si_3N_4$ layer and nitrogen incorporation at low temperatures, between approximately 200° and 750° C., without compromising the film integrity.

As explained previously, the $Si_3N_4$ layers are reoxidized after deposition to improve their dielectric qualities. For example, the reoxidation operates to reduce defects such as pinholes and leakage current. The reoxidation of the $Si_3N_4$ layers typically is accomplished by high-temperature treatment in steam or an oxygen ($O_2$) ambient environment.

With existing fabrication techniques, the $Si_3N_4$ films cannot be reduced below approximately 65 Å because a $Si_3N_4$ layer thinner than this cannot withstand the subsequent oxidation step used to improve the dielectric qualities of the $Si_3N_4$ layer. But, as discussed above, thinner layers are increasingly required to meet industry specification standards.

Due to this method's accommodation of lower temperature reoxidation, this method permits $Si_3N_4$ films to be fabricated thinner than the previous minimum of approximately 65 Å. The $Si_3N_4$ films have not been previously fabricated any thinner than approximately 65 Å because, when made thinner, the $Si_3N_4$ layer could not tolerate the prior art higher temperature reoxidation methods, higher than approximately 750° C., necessary to insure the integrity and quality of the dielectric layer.

In the case of forming a high-quality dielectric on a silicon-containing substrate by direct growth or formation of an oxynitride layer using the present inventive method, the desired oxynitride layer can be obtained wherein the amount and location of nitrogen and oxygen incorporation in the layer can be tailored to specific needs. It is believed that this method harnesses and manipulates the competitive chemical reactions of the various constituents, thereby controlling the amount and timing of atomic nitrogen and oxygen available to react and form the desired dielectric layer.

The method, as described in this illustrative embodiment, includes the steps necessary for understanding and explaining the invention. Other typical fabrication processes that are necessary for the fabrication of a complete device and well known to one skilled in the art may take place sequentially before or after the present method. To avoid confusion, fabrication processes that are not essential to the present method yet might be included in the overall device fabrication are not described herein.

In the illustrative embodiment described here, atomic N is provided, preferably by dissociating molecular nitrogen ($N_2$) through plasma treatment of molecular nitrogen. Means for generating such a plasma are well known in the art and include, for example, a pair of oppositely placed electrodes, inductive coils, microwave sources, and other conductive and inductive power sources. The atomic N is then combined in a specified manner with the NO to permit the controlled formation of a high-quality dielectric.

A typical plasma system that can be used with this process to provide the atomic N is shown schematically in FIG. 1 and is generally designated as 10. A plasma system such as the one shown schematically in FIG. 1 is often referred to commercially as a downstream plasma system. By downstream plasma system, it is meant that a plasma is generated and used to treat a compound and create reactive constituents, in this case atomic N, in a particular location and then the reactive constituents are transported downstream to another location before being used as desired, generally by acting on a target.

Downstream plasma system 10, as shown in FIG. 1, includes a plasma chamber 12 in flow communication by way of conduit 14 with a reaction chamber 22. Using plasma system 10, the atomic N is created by dissociating the molecular nitrogen ($N_2$) before the atomic N is introduced downstream into reaction chamber 22. The atomic N is combined with the NO in a predetermined manner to provide both atomic N and atomic O and is then transported downstream to reaction chamber 22 to react with a target, here substrate 26, to form a high- quality dielectric. The high-quality dielectric is formed either via formation of an oxynitride layer or via the reoxidation of $Si_3N_4$. Plasma chamber 12 has an external energy source 28 to generate the plasma for dissociating molecular $N_2$ to the atomic N necessary for this inventive method. In the present example, external energy source 28 is in the form of a radio frequency (rf) power source inductively coupled to a plasma quartz tube. In this example, a plasma is the preferred means for creating the atomic N, but it can also be created using other suitable means, such as optical activation, thermal activation, ultrasonic activation and the like.

Inside reaction chamber 22 is pallet 24 which supports a plurality of target substrates 26, which is in this example a plurality of semiconductor wafers appropriately prepared for dielectric layer formation. Pallet 24 can be cooled or heated, as desired, to be compatible with the rest of the selected parameters. Optionally, a bias may be applied in the known manner to substrate 26 in reaction chamber 22.

With this configuration, a plasma is created using approximately 3 kW of energy supplied by energy source 28. Power from energy source 28 typically is in the range of 50 watts to 5 kW. The frequency can range between 10 kHz and 200 MHZ with 13.56 MHZ being the most common.

In accordance with this example, the chemical sources for the molecular nitrogen used to provide the atomic N and the NO are supplied as gases, such as can be commonly obtained from pressurized canisters, appropriately connected to plasma system 10. The molecular nitrogen source is connected to supply the gas to plasma chamber 12 and the NO gas source is connected to enter into conduit 14, preferably at the point of staging chamber 16.

As an example, with this arrangement, a plasma is generated in plasma chamber 12 which contains molecular nitrogen ($N_2$). The molecular nitrogen is dissociated to atomic N by the plasma treatment, as shown in FIG. 1. The atomic N is then moved downstream through conduit 14 from plasma chamber 12, preferably through staging chamber 16, prior to being delivered into reaction chamber 22. A selected quantity of NO is also introduced into staging chamber 16 at the same time as the atomic N is present in staging chamber 16. The NO can be injected continuously for a time interval equal to or different than that of the atomic N introduction into reaction chamber 22 to control the amount of reactants present. The time intervals selected would depend on the specific characteristics desired. For example, both the atomic N and the NO could be injected simultaneously for 30 minutes; or to obtain different characteristics, the introduction of the NO could be delayed relative to the atomic N injection and started 5, 10, 15 minutes, or any other desired amount of time, after the start of the atomic N injection. The atomic N, the NO and their reactive products are then transported via conduit 14 to nozzle 20 and are introduced into reaction chamber 22 by way of dispersion nozzle 20 to form the desired high-quality dielectric layer on target substrate 26. The molecular nitrogen is introduced with gas flow rates in the range of 5 to 5000 sccm's (standard cubic centimeters per minute), preferably around 1000 sccm's. In the present illustrative embodiment, using plasma system 10, it is estimated that approximately 10% of the molecular nitrogen is dissociated to atomic N. In this example, to have slightly less NO present than atomic N, the NO would be introduced with a preferred flow rate of approximately 10 sccm's. The flow rate for the NO in this example could range from 1–1000 sccm's.

Figure 3:
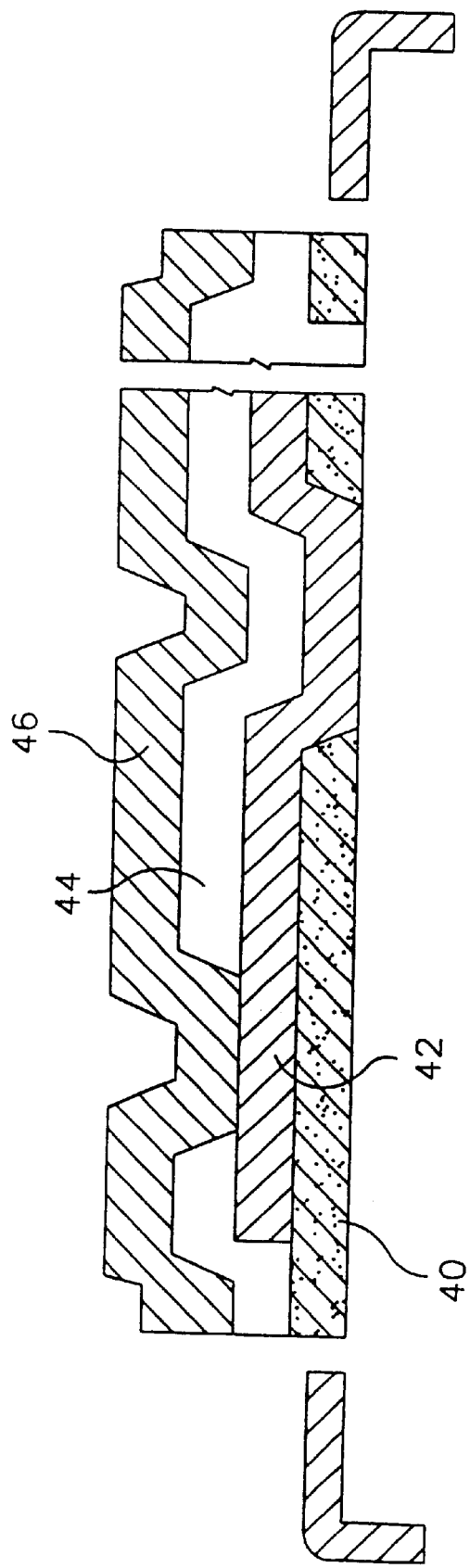
FIG. 3 is a schematic cross-section of a semiconductor die having a high-quality dielectric layer on it, such as would be formed in accordance with the method of this invention.

In the present example, NO is combined with the atomic N in staging chamber 16. Staging chamber 16 is in the form of a substantially "T"-shaped intersection in conduit 14. However, the commingling or intermixing could equally take place in any manner and could comprise any location where the atomic N and NO exist conjointly in a manner that allows them to react with each other to provide the desired reactive constituents of atomic N and atomic O in the presence of target substrate 26, which in this example is located downstream in reaction chamber 22. The combination of the atomic N and NO in staging chamber 16, in this downstream fashion, makes possible the formation of the desired nitrogen- and oxygen- containing dielectric layer, either as the oxidized $Si_3N_4$ layer or oxynitride layer, as shown in FIG. 3, designated as dielectric layer 44. One of the very advantageous aspects of this method is the flexibility to customize the fabricated dielectric. By controlling the quantity of reactable atomic nitrogen and atomic oxygen available, as well as the timing of their availability, the high-quality dielectric layer can be greatly customized, for example, by locating the bulk of the deposited N at the silicon-$SiO_2$ interface or locating it more predominantly in the $SiO_2$ layer.

The downstream plasma approach used with this method, where the plasma is used to dissociate the molecular $N_2$ into atomic N at a first location and is then transported downstream to another location, permits the interaction of atomic N with the NO in a more rapid and efficient reaction than if just molecular nitrogen and NO were used. The use of NO with molecular nitrogen results in an undesirably slow growth of the dielectric layer. This commingling of the highly reactive N and O atoms in this downstream manner helps to ensure formation of the desired reactive constituent atoms and complexes which are believed to be necessary to react to form the desired high-quality dielectric layers as part of this inventive process. A direct plasma approach, that is, treating both the molecular $N_2$ and NO with a plasma in the presence of target substrate 26, would be undesirable. With a direct plasma treatment, the reactive constituents thus formed would not provide atomic N and atomic O in controllable proportions necessary for this method to insure the high-quality dielectric formation. Although not wishing to be bound by any particular theory of the invention, it is believed that the atomic N and atomic O participate in competitive and predictable chemical reactions that can be advantageously manipulated by the present invention to improve nitrogen and oxygen reaction for the formation of high-quality dielectric layers.

Turning to the plasma created in plasma chamber 12, the preferred plasma is a pure nitrogen plasma. Optionally, the nitrogen plasma may include another gas that will not be reactive in the desired dielectric layer formation, such as argon or one of the other noble gases. The methods for forming a noble gas plasma are well known in the art and briefly described above and will not be described in further detail herein.

The process of this invention allows the formation of high-quality capacitor dielectric layers with improved control over the atomic nitrogen and atomic oxygen concentration during the process.

An important advantage of this method resides in its flexibility. Because the atomic nitrogen and atomic oxygen amounts available for utilization can be manipulated with this method, the method can be applied to many different compositions of dielectric layers. For example, high-quality dielectric layer formation by reoxidation of $Si_3N_4$ can be performed on desirably ultrathin layers of $Si_3N_4$ without destroying the thinner layers as would other reoxidation methods.

The controlled creation of nitrogen and oxygen reactive constituents also favor higher production throughputs that are prerequisite to the economic decrease in costs of fabrication of integrated circuits. Accordingly, with the method described herein, products can be manufactured more economically by this process. Such products include, for example, integrated circuits, multichip modules, electronic devices, and the like as can be seen in FIG. 3, which include semiconductor substrate 40, first metal layer 42, high-quality dielectric layer 44 and a second metal layer 46.

It will therefore be understood that modifications and variations are possible without departing from the scope of the invention as expressed in the following claims.

What is claimed is:

1. A method for forming a dielectric layer, comprising:
providing a mixture consisting essentially of atomic nitrogen and atomic oxygen, said atomic oxygen being derived from nitric oxide; and
exposing a substrate comprising a semiconductive material to said mixture.

2. The method of claim 1, wherein said providing comprises deriving said atomic nitrogen at least in part from molecular nitrogen.

3. The method of claim 2, wherein said deriving comprises treating said molecular nitrogen with a plasma discharge.

4. The method of claim 2, wherein said deriving comprises providing said molecular nitrogen at a flow rate of about 1,000 sccm.

5. The method of claim 4, wherein said providing comprises providing said nitric oxide at a flow rate of about 10 sccm.

6. The method of claim 1, wherein said exposing comprises exposing a substrate comprising silicon to said mixture.

7. The method of claim 6, wherein said exposing comprises forming silicon oxynitride on said substrate.

8. The method of claim 1, wherein said exposing comprises exposing a capacitor electrode to s aid mixture.

9. The method of claim 1, wherein said exposing comprises exposing a region of a surface of said substrate located adjacent to at least one active device region formed in said substrate.

10. A method for reoxidizing silicon nitride, comprising:
providing a mixture consisting essentially of atomic nitrogen and atomic oxygen, said atomic oxygen being derived from nitric oxide; and
exposing the silicon nitride to said mixture.

11. The method of claim 10, wherein said providing comprises deriving said atomic nitrogen at least in part from molecular nitrogen.

12. The method of claim 11, wherein said deriving comprises treating said molecular nitrogen with a plasma discharge.

13. The method of claim 10, wherein said exposing comprises exposing a capacitor dielectric to said mixture.

14. The method of claim 10, wherein said exposing comprises exposing a gate dielectric to said mixture.

* * * * *

UNITED STATES PATENT AND TRADEMARK OFFICE
CERTIFICATE OF CORRECTION

PATENT NO. : 6,432,841 B1
DATED : August 13, 2002
INVENTOR(S) : Li Li, Randhir Thakur and Richard Hawthorne It is certified that error appears in the above-identified patent and that said Letters Patent is hereby corrected as shown below:

<u>Column 8,</u>
Line 2, change "s aid" to -- said --

Signed and Sealed this

Twenty-eighth Day of October, 2003

JAMES E. ROGAN
*Director of the United States Patent and Trademark Office*